United States Patent [19]

Normington

[11] Patent Number: 5,281,852
[45] Date of Patent: Jan. 25, 1994

[54] SEMICONDUCTOR DEVICE INCLUDING STACKED DIE

[76] Inventor: Peter J. C. Normington, 516 E. Country Plaza South, Gilbert, Ariz. 85234

[21] Appl. No.: 805,594
[22] Filed: Dec. 10, 1991
[51] Int. Cl.$^5$ ............................................. H01L 23/02
[52] U.S. Cl. ................... 257/685; 257/686; 257/692; 257/693; 257/723; 437/205; 437/208; 437/209
[58] Field of Search ............... 257/685, 686, 692, 723, 257/696, 771, 693; 437/180, 205, 208, 209

[56] References Cited

U.S. PATENT DOCUMENTS

| | | | |
|---|---|---|---|
| 4,500,905 | 2/1985 | Shibata | 257/771 |
| 4,553,020 | 11/1985 | Val | 257/682 |
| 4,770,640 | 9/1988 | Walter | |
| 4,890,154 | 12/1989 | Sahakian | 257/696 |
| 4,935,005 | 5/1990 | Carlson et al. | |
| 4,956,694 | 9/1990 | Eide | 257/723 |
| 4,956,695 | 9/1990 | Robinson et al. | |
| 4,996,587 | 2/1991 | Hinrichsmeyer et al. | 257/686 |
| 5,016,138 | 5/1991 | Woodman | 257/686 |
| 5,053,852 | 10/1991 | Biswas et al. | 257/696 |

Primary Examiner—William Mintel
Assistant Examiner—Roy Potter
Attorney, Agent, or Firm—Cahill, Sutton & Thomas

[57] ABSTRACT

Leadframes from a TAB tape having die attached are curved so that the free ends of the leads curve back over themselves. A separator, attached to the die, defines a pocket for receiving the free end of the leads. The die and separator form a subassembly which is combined with other subassemblies to make the stack. Sides having an array of conductive contact areas connected in a predetermined pattern are placed against the edges of the die to touch the curved leads which form a resilient contact with the sides. A resilient member can be located within the curved leads to support the leads during assembly. In one embodiment, the leads are wrapped around the edges of the die itself. In other embodiments, the leads are wrapped around the edge of the separator.

18 Claims, 3 Drawing Sheets

SEMICONDUCTOR DEVICE INCLUDING STACKED DIE

BACKGROUND

This invention relates to a semiconductor device having a plurality of integrated circuit die in a stack and, in particular, to means for interconnecting the die in the stack.

The continued increase in the density of integrated circuits, i.e. the number of transistors per square centimeter of die area, whets rather than satisfies the appetite of industry for further increases. One solution to the problem is to stack several die one on another within a single package. (For the sake of description only, the stack is assumed vertical, with the die parallel to the upper and lower surfaces. Thus, the side of the stack contains the edges of the die. The die are assumed to be rectangular. "Die" are also referred to as "chips" in the industry.)

As recognized in the art, there are several difficulties with this approach. A first difficulty with stacked die is the limitation imposed by the heat generated by each die. When packaged singly and mounted on a printed circuit board, the heat generated by the die during operation is relatively easily dissipated because the die are spread out across the printed circuit board. When grouped together, particularly in a stack, power dissipation restricts the type of die that can be stacked to relatively low power integrated circuits.

It is generally assumed in the art that the primary cooling mechanism for the die is conductive cooling through the leads from the die, with some radiative cooling from the leads. Thus, organizing the die in a stack according to their power dissipation, e.g. putting the die generating the most heat on top of the stack, is not effective. Further, most applications use identical die in the stack, e.g. memory devices. One can obtain, for example, a four-fold increase in memory size on a given size printed circuit board by using stacked die.

One solution to the problem of heat dissipation is described in U.S. Pat. No. 5,051,865, in which one side of the stack is provided with electrical connections and the opposite side of the stack is provided with a heat sink to which the die are thermally, but not electrically, connected. A problem with this approach is that one side of the stack is devoid of electrical connections, which limits the number of leads that the die can have and, to some extent, limits the geometry of the die.

An ancillary problem to heat dissipation is stress in the die due to thermal cycling. Specifically, the temperature coefficient of expansion for the die should be matched by the package so that the die are not compressed or distorted due to temperature changes. In packages of the prior art, the die are mechanically and electrically connected to the sides, e.g. by soldering. If the sides, top, and bottom of the package do not have the same, or nearly the same, temperature coefficient of expansion as the die, then the die can become stressed as their temperature rises. This can lead to contact separation or fracture of the interconnect layers on the die.

A second difficulty with stacked die is the density of the die themselves. Power supply, ground, control signals, and input and output signals must all be supplied to all die in the stack. The number of leads depends on the particular die but can be as many as four hundred. Thus, the device used to interconnect the die must have at least this number of conductors. In theory, the conductors can be made arbitrarily thin. In practice, thin conductors limit the amount of current that can be carried by the conductors, limit the amount of cooling through the conductors, and make it difficult to align the leads on the die with the conductors which interconnect the die.

The device used to interconnect the die has taken several forms. In U.S. Pat. No. 5,006,925, chip carriers form the sides of the stack and are soldered together. There are holes in the chip carriers for ventilation. In U.S. Pat. No. 4,983,533, a plurality of die are glued together and electrically connected by solder bumps on a silicon substrate attached to the side of the stack.

U.S. Pat. No. 4,935,005 discloses depositing conductors on the sides of the already formed stack to contact the leads from the die. The die are attached to TAB (tape automatic bonding) leadframes, mounted on an insulating member having a recess for receiving the die. The tape is used to align the die while the die and insulating members are glued together. The portions of the tape extending beyond the insulating member are then removed and the conductors are deposited. A TAB leadframe is also disclosed for connecting the stack to a small circuit board which serves as the bottom of the package and which carries a plurality of conductive pins.

Each stage of an assembly process introduces defects which must be detected and corrected. Taking apart stack packages of the prior art is difficult or impossible to do non-destructively. Depending upon the number and type of die used, it is often less expensive to throw a defective stack away rather than to repair it.

In view of the foregoing, it is therefore an object of the invention to provide an improved package for stacked semiconductor die.

Another object of the invention is to provide a package for stacked semiconductor die which can be disassembled.

A further object of the invention is to provide a method for packaging stacked semiconductor die.

Another object of the invention is to provide a resilient connection between semiconductor die and the sides of a stack.

A further object of the invention is to provide a package for stacked semiconductor die in which the temperature coefficient of expansion of the package need not be matched to that of the die.

Another object of the invention is to provide a package for stacked semiconductor die which enables improved fluid flow around the die for cooling the die.

SUMMARY

The foregoing objects are achieved in the invention wherein the die to be stacked are attached to leadframes on a TAB tape. The leadframes from a TAB tape are separated from each other and the leads on each of the four sides are curled back on themselves with the leads on the outside to form a resilient contact. An insulating member is attached to the back of the die to hold the leads in place by trapping the leads in a peripheral pocket within which the leads can move. The die and insulating member are a subassembly which is then combined with other subassemblies to form a stack with alternating layers of die and insulating members. The stack is not glued together. Sides, having a suitable conductive pattern on their inside surfaces, are brought into registration with the leads from the die. The curved tape and leads form a resilient contact with the sides. The sides are electrically connected, preferably by a flexible circuit, to a substrate containing a plurality of connector pins and serving as the bottom of the package. A top is mechanically attached to the sides, completing the package. Because the contacts for the sides are the leads partially wrapped around the die itself, a very compact stack is obtained. In an alternative embodiment of the invention, the leads are wrapped around a die carrier, which also serves as a separator. In another alternative embodiment of the invention, the outer ends of the leads are wrapped around the separator.

A more complete understanding of the invention can be obtained by considering the following detailed description in conjunction with the accompanying drawings in which.

DETAILED DESCRIPTION

Figure 1:
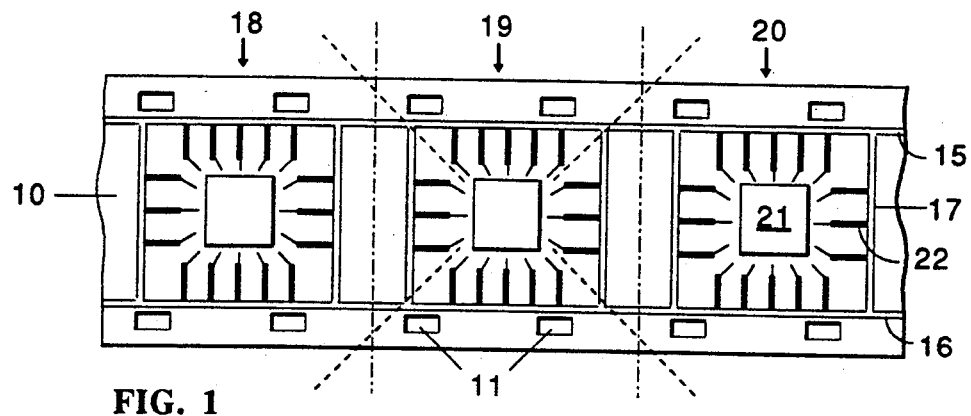
FIG. 1 illustrates a TAB leadframe assembly for use in accordance with the invention.

FIG. 1 illustrates a small section of TAB tape having three die thereon. Specifically, tape 10 typically comprises a layer of polyimide one to four mils (0.025-0.1 mm.) thick. For use in the invention, one mil (0.025 mm.) tape is preferred. A row of regularly spaced sprocket holes 11 is formed along each edge of the tape for locating and moving the tape. Deposited on the tape, and located relative to sprocket holes 11, is a repeating pattern of conductive material comprising conductive runs 15 and 16, bars 17, and leadframes 18, 19, and 20.

Each leadframe comprises a plurality of leads, such as lead 22, extending radially outward from die 21, which is attached to the tape at the center of each leadframe by a suitable adhesive. A substantial portion of each lead is aligned as shown, perpendicular to the edge of the die, to provide a contact as described below. As well known in the art, contact regions are formed in the upper surface of die 21 and are connected to respective leads by wire bonding, welding, or solder bumps.

Figure 2:
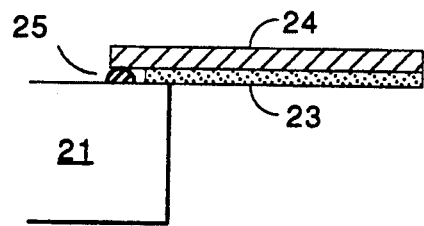
FIG. 2 illustrates a lead bonded to a die in accordance with the invention.

FIG. 2 illustrates a lead connected to die 21 by a solder bump. The solder bump simply comprises a solder bead formed as the uppermost metal layer in a contact region on die 21. After the end of lead 24 is located above solder bump 25, heat is applied to melt the solder and form the electrical connection. As previously indicated, polyimide layer 23 preferably has a thickness of one mil (0.025 mm). The conductive layer preferably comprises copper approximately 1.5 mils (0.038 mm.) thick having a thin gold layer deposited thereon for corrosion resistance and lower contact resistance.

The leadframes and die are not packaged at this point, as in the TAB process, but are separated along the vertical cut lines indicated in FIG. 1 and placed in a suitable fixture for bending the leads. The tape is cut along the diagonal lines indicated in FIG. 1 and the polyimide layer and the leads are bent to form resilient contacts in accordance with the invention. The leads are either trimmed to separate them from runs 15 and 16 and bars 17 or are left connected at this point.

Figure 3:
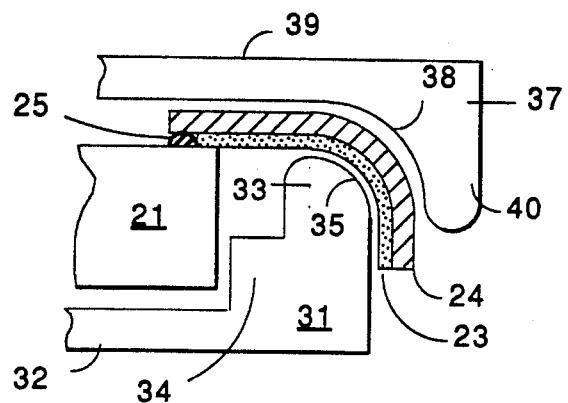
FIGS. 3 and 4 illustrate the curvature of the leads in accordance with the invention.

If there are a large number of leads, it is preferred that the runs and bars remain. This is because a large number of leads necessitates a narrower lead. Even though the leads are attached to the polyimide layer, the bars and runs provide additional strength as well as maintain the stiffness of the tape in the FIG. 3 illustrates a portion of the tool for bending the leads. Fixture 31 comprises a base portion 32 and a perimeter wall 33. Shoulder 34 spaces die 21 a predetermined distance from wall 33. Upper surface 35 of wall 33 is curved. Mold 37 has a complementary curve formed between upper surface 39 and side 40 thereof.

Initially, lead 24 extends away from the edge of die as illustrated in FIG. 2. After being placed in fixture 31, mold 37 is lowered over fixture 31, bending the outer portion of lead 24 into a curved shape, deforming it. The lead is bent with the underlying polyimide layer on the inside of the curve. Mold 37 curves the lead back on itself through approximately a ninety degree curve. The mold is then removed. If the bars and runs were not removed earlier, they are removed now since the curvature of the lead and polyimide layer provides adequate stiffness along the edge of the die.

Figure 4:
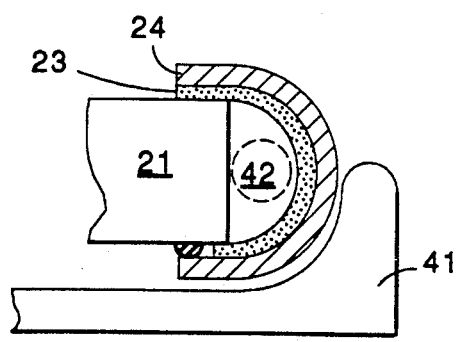

As illustrated in FIG. 4, resilient member 42 is optionally provided to support the leads along each side of the die. Member 42 preferably comprises silicon rubber or other suitable compliant material. Member 42 is formed in a square loop and placed around the die. Mold 41 is similar to mold 37 except that it fits more closely around die 21 to curve lead 24 about the edge of die 21, and member 42 if present.

The first molding operation bends the leads on all four sides of the die simultaneously. For the second molding operation, the die is inverted and inserted into mold 41, thereby curving the inner portions of the leads so that the leads extend further back on themselves, completely around the edge of die 21. The die is self-centering when placed in mold 41 because the leads were partially curved. The radius of curvature of the leads is slightly greater than half of the thickness of die, e.g. about ten to thirteen mils (0.25-0.33 mm.). Since the copper deforms, the leads retain their curved shape. The inner polyimide layer acts as an insulator, preventing the leads from becoming shorted against the edge or back of die 21.

Separator 51 (FIGS. 5 and 6) is attached to die 21 with adhesive 52 which can comprise any suitable adhesive, such as what is known as room temperature epoxy (an epoxy that is kept refrigerated until use and cures at room temperature in about thirty minutes). Separator 51 can comprise any material, including plastic or ceramics, that is at least electrically insulating. Preferably the material is also thermally conducting, such as what is known as filled epoxy. It can also comprise sapphire, silicon, or glass. The thermal conductivity of the separator must be balanced against the cost of the material. Sapphire and some thermally conductive ceramics, such as beryllium oxide, are expensive.

Separator 51 is approximately the same size as the die to which it is attached. As shown in FIG. 6, separator 52 has recesses or rabbets 54 and 55 in the upper and lower edges thereof. When attached to the die, the recess along the edge facing the die forms pocket 56 (FIG. 5) for loosely containing lead 24 and polyimide layer 23. Thus, any sideward force on lead 24 causes the lead to flex slightly and the end of lead 24 can move within pocket 56 if necessary. This enables the lead to absorb a greater range of flexure of lead 24 than would otherwise be possible.

As illustrated in FIG. 6, separator 51 preferably includes central aperture 58 extending through the central portion of separator 51 to facilitate the flow of cooling fluid to the back of die 21. Bores 59 at each corner of the separator extend from the outside surface to central aperture 58, enabling fluid to flow through the separator and contact the die.

Figure 5:
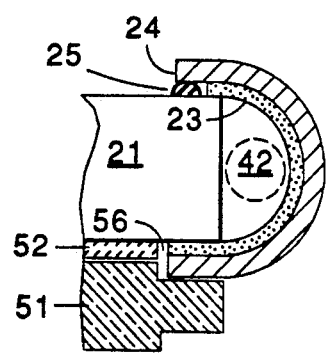
FIG. 5 shows one side of a subassembly constructed in accordance with the invention.
Figure 7:
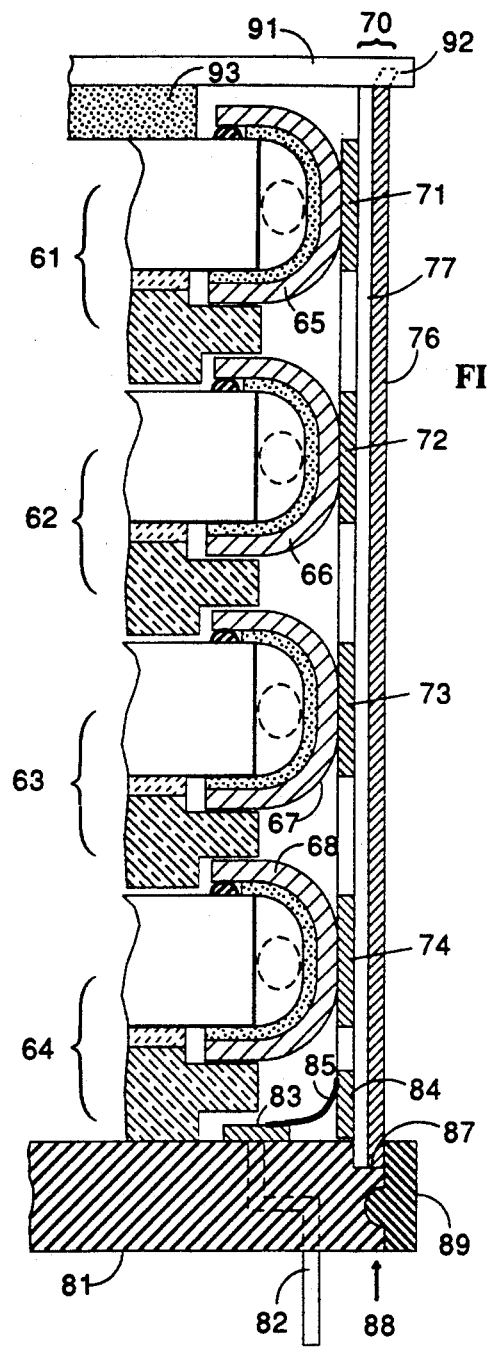
FIG. 7 shows a cross-section of a portion of a stack package constructed in accordance with the invention.
Figure 6:
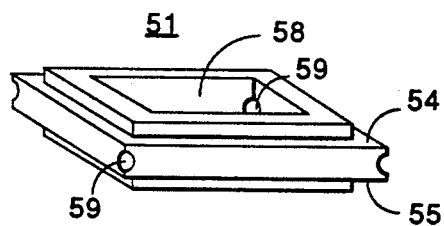
FIG. 6 illustrates a separator constructed in accordance with the invention.

As thus constructed, the die and separator of FIG. 5 form a subassembly which can be combined with other subassemblies to form a stack having alternate layers of semiconductor die and separators. One side of a packaged stack is illustrated in FIG. 7 wherein four subassemblies are combined within one package.

Figure 8:
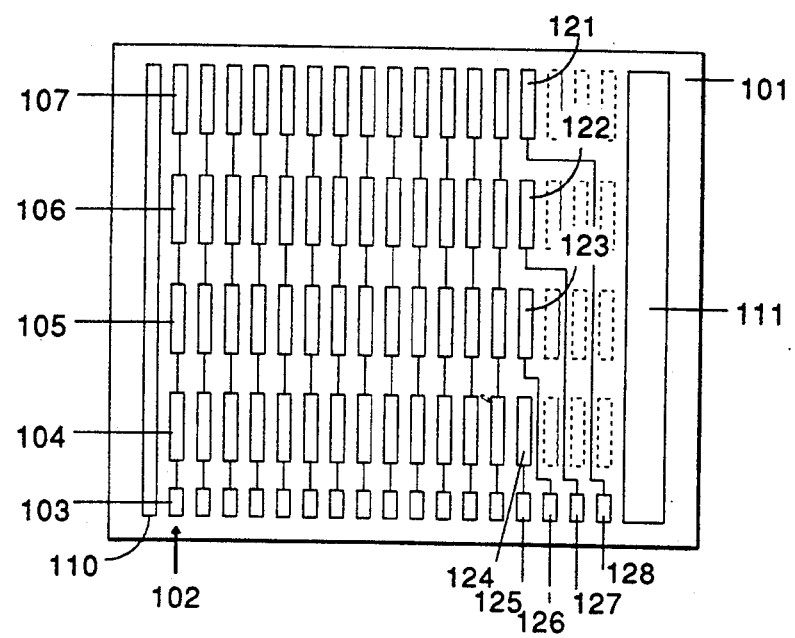
FIG. 8 illustrates a side of a package having conductors patterned in accordance with the invention.

Subassemblies 61-64 are stacked but not fastened to each other with leads 65-68 fitting within the pockets formed with the separators, both above and below the separators. Side 70 has contact areas 71-74 aligned or registered with leads 65-68. Side 70 preferably comprises metal plate 76 having insulating layer 77 facing the sides of the die. A patterned conductive layer, described in detail in conjunction with FIG. 8, is formed on the insulating layer and defines contact areas 71-74. The metal plate is preferably stainless steel and the insulating layer is preferably an epoxy. The conductors preferably comprise copper with a thin gold outer layer for corrosion resistance and lower contact resistance.

The subassemblies rest on substrate 81. The substrate includes a plurality of pins, such as pin 82, which extend through substrate 81 and terminate in a contact pad. Contact pad 83 is connected to contact 84 on side 70 by way of wire 85, which is bonded to the contact and pad, e.g. by soldering or welding. The substrate preferably comprises a plastic material, such as used for packaging semiconductor devices, which is molded about the contact pins. Ceramic or printed circuit board substrates can be used instead. Wire 85 preferably comprises one of a plurality of wires on a flexible circuit, like a TAB leadframe. This not only provides automatic registration of the wires but also greatly increases the speed with which the connections can be made.

The edge of substrate 81 has a couple of details which facilitate assembly. A first detail is recess 87 which receives the lower edge of side 70. A second detail is cove 88 formed in the edge of the substrate for receiving a corresponding bead on perimeter frame 89. Perimeter frame 89 is a hollow square or rectangle which fits around the bottom of the stack to engage substrate 81 and hold the sides in place.

In manufacturing a stack package in accordance with the invention, the substrate and sides form a second subassembly. The sides are connected to the substrate by a flexible circuit but are otherwise not rigidly attached thereto. Because of recess 87, the sides can lie flat adjacent the substrate. The subassemblies of die and separators are placed on the substrate and the sides are rotated into a vertical position with the bottom edges of the sides located in the recess. The substrate, sides, and die are then inserted into the perimeter frame, which fastens the bottom of the sides.

Top 91 is placed over the assembly and engages sides 71 for locating the sides vertically. The top end of side 70 is preferably angled outwardly to engage recess 92 for securing the top to the sides. Resilient means 93, such as an elastomer layer, applied to the underside of top 92, rests on the uppermost die to hold the die in position. One thus obtains a mechanically assembled package which is not permanently fastened. Defective sides or die are readily replaced. The use of a series of subassemblies, the TAB tape, die and separator, and substrate and side, facilitates rapid manufacture of devices.

As illustrated in FIG. 7, contact with the sides cause the leads to flex, distorting the curvature of the leads. Up to a point, this is intended to assure a good mechanical contact. It is not intended that the leads b crushed against the edge of the die. It is preferred that the leads be moved no closer than half the distance to the edge of the die.

FIG. 8 shows a side having an array of conductors for interconnecting the die. Side 101 has a plurality of contact areas arranged in rows and columns. Column 102 comprises contact areas 103-107 connected by a narrower conductor. In one embodiment of the invention, the contact areas comprise two mil wide conductors on four mil centers, i.e. two mil wide conductors and two mil wide spaces between any two conductors. The height of the contact areas is preferably the thickness of the corresponding die. This provides a high density of contact areas, yet is readily attainable with present technology. It also assures reliable registration with the die.

The contact areas are separated into rows to avoid unintended connections between die. If the current causes excessive voltage drop in a column, then the entire column can be a full width conductor, as shown by conductor 110. If even that is insufficient, rows can be ganged together with the space between covered over with conductive material. Conductor 111 is the width of two columns plus the space between them.

The contact areas are not limited in configuration to being connected in columns but can be connected in other combinations, depending upon the particular die used and whether or not the die are identical. Even if the die are identical, the contact areas need not be arranged in columns. For example, the chip select lead on several memory die must be brought out to separate pins. Assuming that the column containing contact areas 121-124 corresponds to the chip select lead on each die, then contact areas 125-128 need to be connected to contact areas 121-124, respectively, in order to properly (uniquely) address each die. Thus, contact 121 is connected to contact 128, three columns away. Contact 122 is connected to contact 127; contact 123 is connected to contact 126; and contact 124 is connected to contact 125.

The contact areas shown in dotted line in FIG. 8 are either left disconnected or are omitted. Although contacts 121-123 are illustrated as connected to contacts 126-128 by way of a zigzag pattern of conductor, it is understood that a multilayer conductive pattern can be used instead for all of the contacts. As noted above with the choice of material for the separator, the trade-off here is cost. Multilayer conductor patterns are more expensive.

Figure 9:
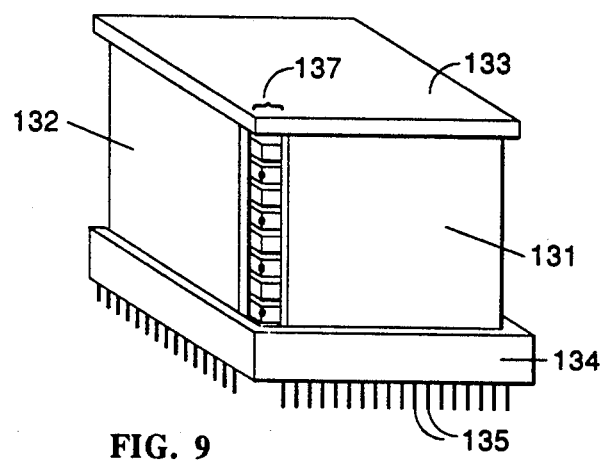
FIG. 9 illustrates a complete package constructed in accordance with the invention.

FIG. 9 illustrates a complete stack package constructed in accordance with the invention. Perimeter frame 134 surrounds the substrate containing a plurality of conductive pins 135 and holds the walls, including sides 131 and 132 in place. Top 133 is fastened to the sides as described. The sides do not fill the available space between the corners of perimeter frame 134. This provides a gap, such as gap 137, at each corner of the package for enabling cooling fluid to flow through the device through the apertures in the separators.

The embodiment of FIG. 9 assumes that the package is being used in a sealed environment providing fluid flow. If this is not the case, then the structure of the separator is greatly simplified. Central aperture 58 and bores 59 can be eliminated. The structure of FIG. 9 is sealed, e.g. by potting or separate walls around the sides, with the walls sealed to each other and the top and bottom.

Figure 10:
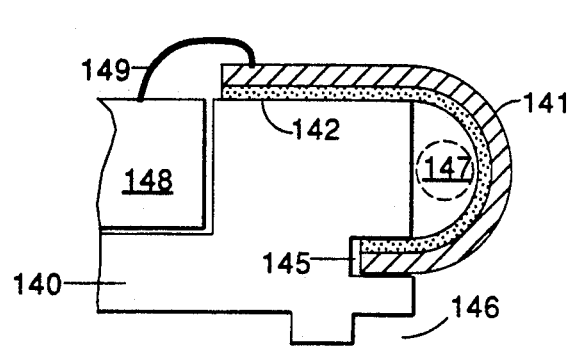
FIG. 10 illustrates a portion of a subassembly constructed in accordance with a alternative embodiment of the invention.

FIG. 10 illustrates a portion of a subassembly constructed in accordance with an alternative embodiment of the invention. Specifically, separator 140 comprises a die carrier; i.e. it is substantially wider than the die and includes a recess for receiving die 148. Lead 141 from a TAB leadframe is bent over the edge of the separator so that lead 141 is on the outside of the curve and insulator 142 is on the inside of the curve. The inner end of insulator 142 is attached to the upper surface of separator 140 by a suitable adhesive (not shown).

The free ends of lead 141 and insulator 142 extend into pocket 145 where they are free to move slightly. Recess 146 provides clearance for other subassemblies or for the connections to the bottom of the package. Resilient member 147 is optionally provided and, as in the embodiment of FIGS. 4–6, preferably comprises a square loop of material which is placed around the separator. Wire bond 149 connects one contact on die 148 to lead 141.

Die 148 can be attached to separator 140 either before the leads are curved or after. If the leads extend over the die, as in FIG. 2, then the leads can be soldered or welded to the die. If the leads do not extend over the die, then the leads are wirebonded to the die. Thus, an advantage of this embodiment is that the die can be connected after the leads are bent, resulting in somewhat less handling of the die. Another advantage of this embodiment is that the separators act as adapters for different size die. A disadvantage of this embodiment is that the package becomes considerably larger due to the increased width and length of the separator.

Figure 11:
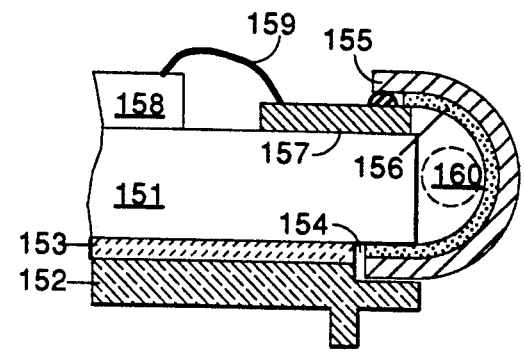
FIG. 11 illustrates a portion of a subassembly in which the separator is a multi-element means.

Lead 141 and insulator 142 extend some distance inwardly from the edge of separator 140. One could substitute a conductive layer deposited on separator 140 for a portion of the lead. In this case, the lead is connected to the conductive layer by a solder bump, as in FIG. 5. Conductive patterns are easily and inexpensively formed on silicon substrates, which can also serve as insulators. FIG. 11 illustrates a portion of a subassembly in which the separator is a multi-element means including silicon substrate 151 and insulator 152 connected by adhesive 153. Adhesive 153 can comprise any suitable adhesive such as epoxy or solder glass.

Substrate 151 and insulator 152 form pocket 154 for receiving the free ends of lead 155 and flexible insulator 156. The other end of lead 155 is attached to metal layer 157 formed on the upper surface of substrate 151. Metal layer 157 is connected to a contact on die 158 by wire bond 159. Die 158 is attached to substrate 151 by adhesive or intermediate fused glass layers or other means well known per se in the art. As with other embodiments of the invention, resilient means 160 is optionally provided.

The embodiment of FIG. 11 enables one to use die of various sizes simply by making substrate 151 the size of the largest die in the stack. In addition to being able to combine die of various sizes in a single stack, thermal stress is reduced since the die are mounted on a silicon substrate. Metal layer 157 is easily formed using techniques long known in the semiconductor art. Multi layer conductors can be used instead of the single layer illustrated.

Figure 12:
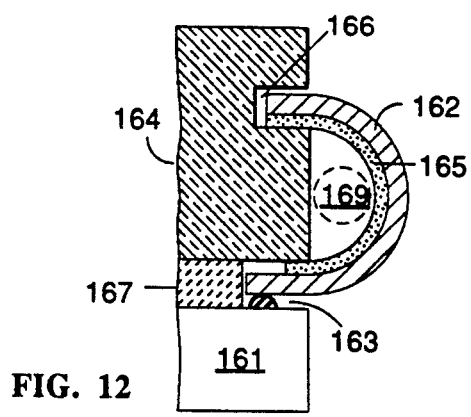
FIG. 12 illustrates a portion of a subassembly constructed in accordance with another alternative embodiment of the invention.

FIG. 12 illustrates a cross-section of a portion of a subassembly constructed in accordance with another alternative embodiment of the invention. For this embodiment, the leadframe of the TAB tape is bonded face down to the die so that the tape is above the leadframe. Specifically, die 161 has a contact connected to lead 162 by solder bump 163. Lead 162 is wrapped about a portion of separator 164, with insulator 165 on the inside of the curve, and engages pocket 166. Separator 164 is attached to die 161 by sealing means 167. Sealing means 167 can comprise a polyimide ring or a sealing glass having a low melting point. Resilient member 169 is optionally provided to support the leads during compression from the sides of the stack.

Unlike the embodiment of FIG. 6, separator 164 preferably does not have an aperture extending completely through the separator. Instead, the lower surface of the separator is intact so that bores 59 communicate with a central opening extending through the upper surface only. By sealing the upper surface of die 161 to separator 164, one protects the die from ambient particles and moisture. However, the back side of the die is exposed to the cooling flow of fluid through the separator of the next lower subassembly in the stack or the bottom of the stack.

As with the embodiment of FIGS. 10 and 11, the embodiment of FIG. 12 can accommodate die of different sizes without substantially increasing the overall size of the package. In this case, the separators should all be the same size, viz. the size of the largest die to be included in the stack.

The invention thus provides an improved package for stacked die. Heat generated during operation does not stress the die as much since they are not rigidly connected to the sides of the package. Further, the package can be disassembled in the event that the completed device fails final test. This provides significant cost savings over other packages. Leads can be brought out all four sides of the package, increasing the complexity the integrated circuit die that can be accommodated in the stack. Alternatively, because the entire periphery of the die can be used for leads, the same number of leads can be spread over a greater area, thereby simplifying registration of the leads with the conductors and increasing the heat conductivity of the leads by increasing their width. The heat generated by the stack is more readily removed by virtue of the construction of the separators and the open corners of the package. Alternatively, the separators can be solid and made from electrically insulating, thermally conducting material such as sapphire, silicon, or thin glass.

Having thus described the invention, it will be apparent to those of skill in the art that various modifications can be made within the scope of the invention. For example, while illustrated as having a circular cross-section, resilient members 42, 147 can have any suitable cross-section. Separator 51 need not be a solid insulator but can comprise a multilayer device, e.g. an electrically conductive layer between two insulating layers forming a central ground plane for shielding the die from RF. The ground plane can be connected either to the sides or to the ground lead on the die.

Side 70 need not comprise the multilayer member described but can comprise silicon having the conductors, contacts and insulators made in accordance with well known semiconductor processing technology. Multilevel conductors can be employed in the substrate and in the sides. This is particularly useful when more than one stack is mounted to a substrate, because of the number of leads emanating from several stacks.

Although a simple snap mechanism is used to hold top 91 in place, a variety of fastening means can be used to hold the package together. For example, an external member engaging the substrate and the top can be used instead of the angled ends of the sides to hold the package together. Although described in the context of a stacked die package, where connections are made between die, sides made in accordance with the invention can also be used to make connections between points on the same die; i.e. some of the contact areas can be connected to each other within a row, not just in columns.

What is claimed is:

1. A three dimensional semiconductor device comprising:
   a plurality of integrated circuit die each having a plurality of contacts along at least one edge thereof;
   a plurality of separators;
   said die and said separators arranged in a stack of alternating layers of die and separators, wherein said one edge of all of the die face in the same direction;
   a plurality of electrically conductive leads arranged in groups, one group for each die, the leads in each group having inner and outer ends, wherein the inner ends are connected one each to the contacts on a die and the outer ends are curved over said one edge;
   connector means having a plurality of electrically conductive contact areas connected in a predetermined pattern in an array, wherein said connector means is located adjacent said one edge of said die and the curved portions of said leads resiliently contact said connector means.

2. The device as set forth in claim 1 wherein each of said separators includes a pocket for receiving said outer ends of said leads.

3. The device as set forth in claim 2 wherein each of said separators comprises a major surface having a recess along one edge thereof adjacent said one edge of said die and wherein a separator and a die together define said pocket.

4. The device as set forth in claim 2 wherein each of said separators comprises first and second major surfaces and four sides interconnecting said surfaces, wherein one of said sides includes said pocket.

5. The device as set forth in claim 4 wherein each of said separators has a central recess in one of said major surfaces for receiving one of said die.

6. The device as set forth in claim 1 wherein said connector means form sides adjacent said stack and wherein said array of contact areas is on the interior surface of at least one of said sides.

7. The device as set forth in claim 6 and further comprising:
   a substrate having a plurality of connector pins; and
   means for connecting said substrate to said sides.

8. The device as set forth in claim 7 wherein said means for connecting comprises a flexible circuit member.

9. The device as set forth in claim 7 wherein said substrate has a recess formed in the upper edge thereof for receiving said sides.

10. The device as set forth in claim 9 wherein said connector means includes a frame fitting around said substrate and a portion of said sides.

11. The device as set forth in claim 6 wherein said sides are smaller than the corresponding edges of the die and the corners of said separators are not covered by said sides.

12. The device as set forth in claim 1 wherein said separators include a silicon substrate having a patterned conductive layer thereon connected between said die and said leads.

13. A method for making electrical contact to a plurality of integrated circuit die in a stack of alternating layers of die and separators, said method comprising the steps of:
   attaching each of said die to a leadframe;
   curving the leads of said leadframe back on themselves to form resilient contacts; and
   engaging said contacts with a connecting means by pressing said resilient contacts against said connecting means.

14. The method as set forth in claim 13 wherein said curving step comprises:
   curving the leads of said leadframe over an edge of the die without touching said edge.

15. The method as set forth in claim 13 wherein said curving step comprises:
   curving the leads of said leadframe over an edge of a separator adjacent a die.

16. A three dimensional semiconductor device comprising:
   a plurality of integrated circuit die each having a plurality of contacts along at least one edge thereof wherein said die are arranged in a stack with said one edge of all of the die facing in the same direction forming a side of said stack;
   connector means having a plurality of electrically conductive contact areas on a major surface thereof, said connector means positioned adjacent said side with said major surface facing said side;
   a plurality of electrically conductive leads, each of said leads having an inner end and an outer end, wherein the inner end of each lead is connected to one of said contacts along said one edge and the outer end of each lead is connected to one of said contact areas on said connector means.

17. The three dimensional semiconductor device as set forth in claim 16 wherein said plurality of electrically conductive leads comprise a plurality of leadframe and said die are connected one each to said leadframes.

18. The three dimensional semiconductor device as set forth in claim 16 wherein said inner end of each lead is attached to said die and said outer end of each lead resiliently touches one of said contact areas.

* * * * *